United States Patent
Yang

(10) Patent No.: US 9,104,388 B2
(45) Date of Patent: Aug. 11, 2015

(54) HEAT DISSIPATING MODULE AND COMPUTER USING SAME

(71) Applicant: HON HAI PRECISION INDUSTRY CO., LTD., New Taipei (TW)

(72) Inventor: Feng-Chi Yang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 247 days.

(21) Appl. No.: 13/855,877

(22) Filed: Apr. 3, 2013

(65) Prior Publication Data

US 2013/0301212 A1 Nov. 14, 2013

(30) Foreign Application Priority Data

May 14, 2012 (CN) .......................... 2012 1 0147255

(51) Int. Cl.
| | |
|---|---|
| *G06F 1/20* | (2006.01) |
| *F28D 1/02* | (2006.01) |
| *H01L 23/467* | (2006.01) |
| *H01L 23/367* | (2006.01) |
| *H01L 23/427* | (2006.01) |
| *F28D 15/02* | (2006.01) |

(52) U.S. Cl.
CPC ................ *G06F 1/20* (2013.01); *F28D 1/0233* (2013.01); *F28D 15/0233* (2013.01); *F28D 15/0275* (2013.01); *H01L 23/3672* (2013.01); *H01L 23/427* (2013.01); *H01L 23/467* (2013.01); *F28F 2215/00* (2013.01); *H01L 2924/0002* (2013.01)

(58) Field of Classification Search
CPC ... G06F 1/20; F28D 15/0233; F28D 15/0275; F28F 2215/00; F28F 13/12
USPC .......... 361/679.46, 679.47, 679.54, 690–691, 361/697–702, 709–711; 257/717–722; 165/104.33
See application file for complete search history.

(56) References Cited

U.S. PATENT DOCUMENTS 5,734,552 A * 3/1998 Krein ............................ 361/695
6,955,215 B2 * 10/2005 Al-Garni et al. ............... 165/185

* cited by examiner

*Primary Examiner* — Jayprakash N Gandhi
*Assistant Examiner* — Mukund G Patel
(74) *Attorney, Agent, or Firm* — Novak Druce Connolly Bove + Quigg LLP

(57) ABSTRACT

A heat dissipating module includes a heat sink and an aerofoil deflector above the heat sink. The heat sink has an upper surface corresponding to the camber of the deflector, to increase the speed and efficiency of a cooling airflow passing therethrough, the airflow generated by a fan.

15 Claims, 4 Drawing Sheets

HEAT DISSIPATING MODULE AND COMPUTER USING SAME

BACKGROUND

1. Technical Field

The present disclosure relates to heat dissipation from computer systems, and particularly to a CPU heat dissipating module and computer system using the heat dissipating module.

2. Description of Related Art

A central processing unit (CPU) of a computer generates a significant amount of heat which must be rapidly dissipated to prevent deterioration of the CPU. Usually, a heat sink is mounted on the CPU to dissipate the heat from the CPU according to the airflow created by a fan of the computer. However, when the fan is working at low speed, the airflow generated by the fan is not strong enough to dissipate the heat from the CPU to keep the CPU under a desired temperature.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one".

Figure 1:
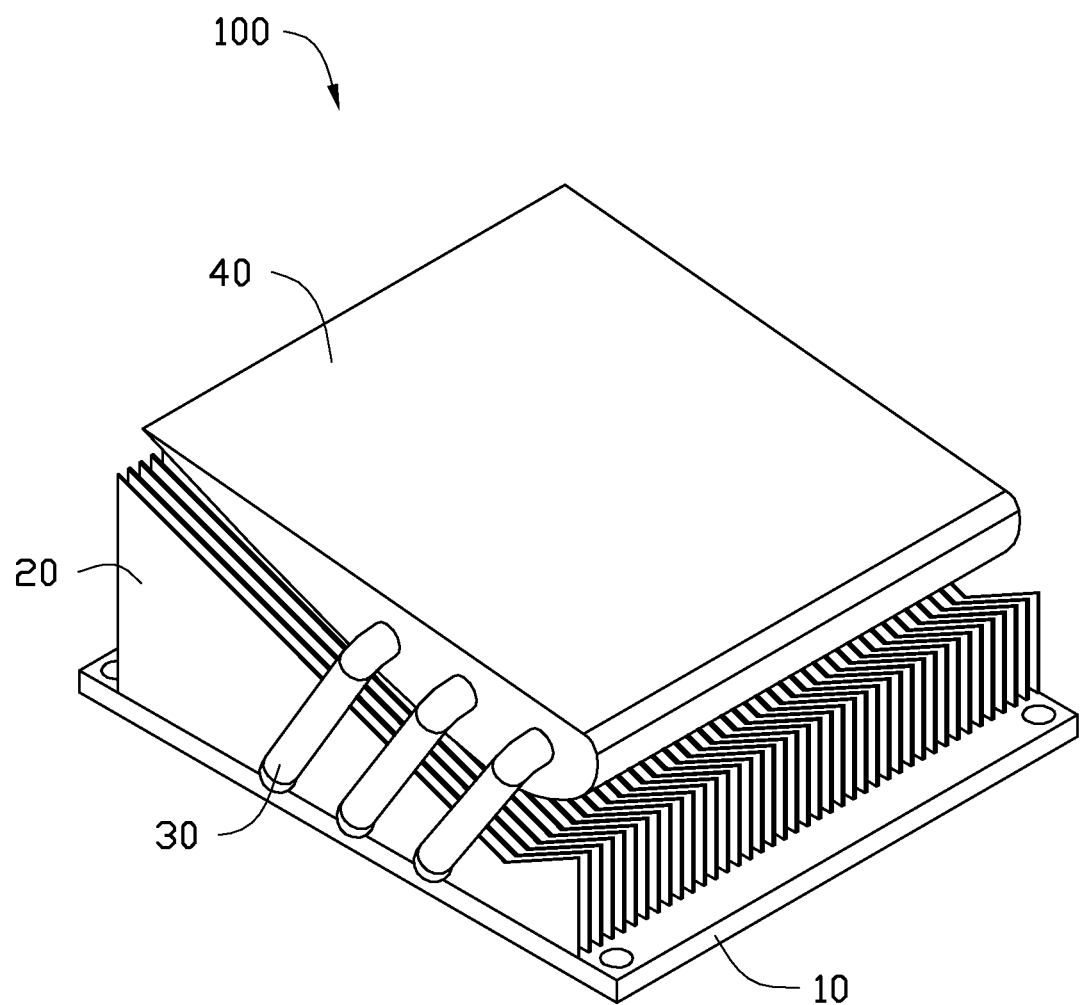
FIG. 1 is an exploded, isometric view of an exemplary embodiment of a heat dissipating module.

FIG. 1 is an exploded, isometric view of an exemplary embodiment of a heat dissipating module 100. The heat dissipating module 100 can be mounted on a CPU (not shown) of a computer. The heat dissipating module 100 includes a pedestal 10, a heat sink 20, a plurality of heat pipes 30, and a deflector 40.

Figure 2:
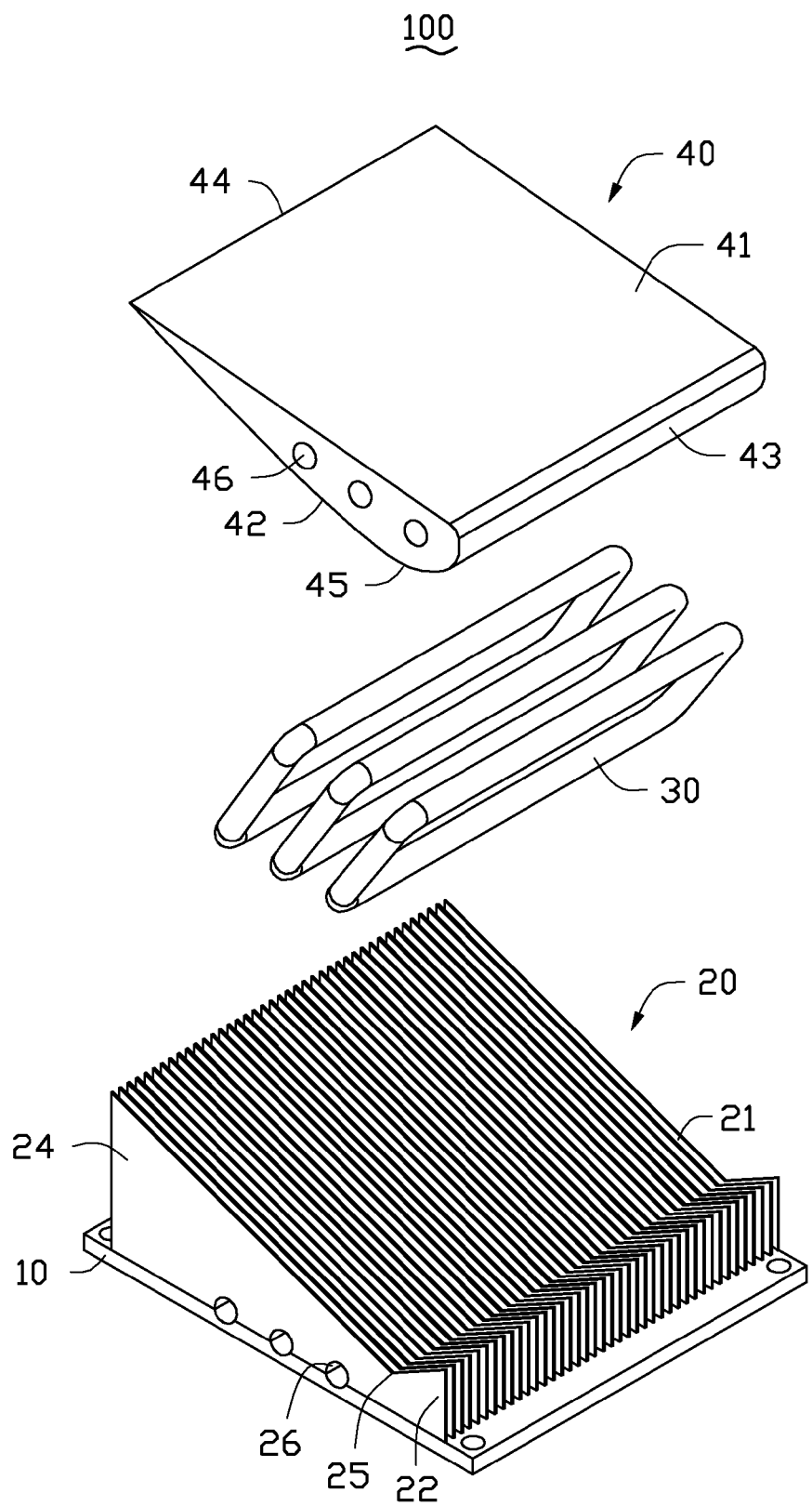
FIG. 2 is an isometric view of the heat dissipating module shown in FIG. 1.

FIG. 2 is an isometric view of the heat dissipating module 100 shown in FIG. 1. Referring to FIG. 1 and FIG. 2, the pedestal 10 can be a heat conducting board of a predetermined thickness. The pedestal 10 is mounted to a CPU, and conducts heat from the CPU.

The heat sink 20 includes a plurality of fins 21 mounted perpendicularly on the pedestal 10. The fins 21 extend front-to-back along the pedestal 10. In the present embodiment, the heat sink 20 and the pedestal 10 are made by a stamping process. The heat sink 20 takes heat from the pedestal 10. From a side view, the heat sink 20 has an upper surface in the shape of a V, along a direction of the airflow flowing therethrough, and includes a leading end 22, a valley 25, and a trailing end 24 from front to back. The leading end 22 faces an airflow, such as that created by a fan of the computer. The trailing end 24 is higher than the leading end 22. The valley 25 is defined between the trailing end 24 and the leading end 22, but nearer the leading end 22 and more remote from the trailing end 24, and thus divides the upper surface into two inclined sub-surfaces. The two inclined planes have predetermined angles from the horizontal plane. A plurality of passages are formed between the plurality of fins 21, parallel to the direction of the airflow. When the airflow passes through the passages, the airflow removes the heat from the heat sink 20. Several holes 26 are defined at the junction between the heat sink 20 and the pedestal 10. In another embodiment, the holes 26 are only defined on the heat sink 20.

Each of the heat pipes 30 are effectively endless, forming a closed ring substantially in the shape of a rectangle. Each heat pipe 30 includes a lower portion, two arms, and an upper portion. The lower portion of each heat pipe 30 is inside a hole 26. The two arms of each heat pipe 30 are located on opposite sides of the heat sink 20. The upper portion of each heat pipe 30 protrudes above the upper surface of the heat sink 20. In the present embodiment, the heat pipes 30 are copper, and conduct heat away from the heat sink 20 and the pedestal 10.

Figure 3:
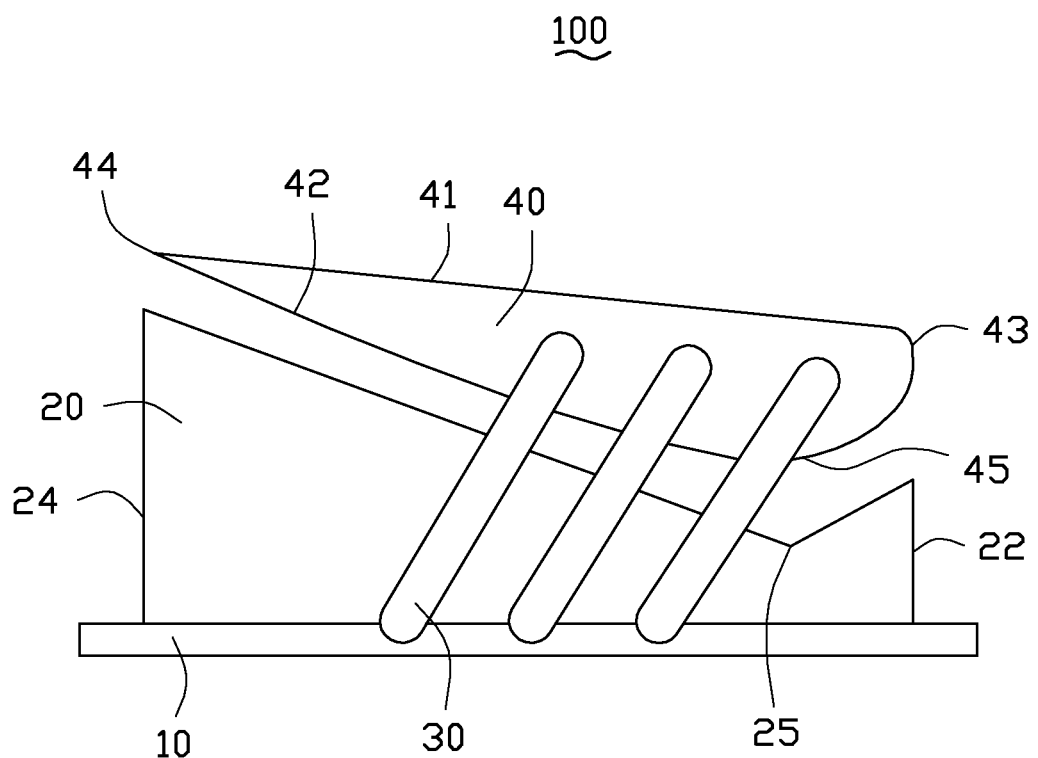
FIG. 3 is a side elevational view of the heat dissipating module shown in FIG. 1.

FIG. 3 is a side elevational view of the heat dissipating module 100 shown in FIG. 1. Referring to FIG. 2 and FIG. 3, the deflector 40 is aerofoil-shaped but inverted. In position, the deflector 40 includes a flat top surface 41, a curved bottom surface 42, a leading edge 43, and a trailing edge 44. The top surface 41 and the bottom surface 42 oppositely merge together at the leading edge 43 and at the trailing edge 44. The deflector 40 defines several connecting holes 46 through two lateral surfaces. The upper portion of each heat pipe 30 is runs through a connecting hole 46, so that the heat pipes 30 support the deflector 40 above the heat sink 20 with at a predetermined distance. The bottom surface 42 faces the upper surface of the heat sink 20. The leading edge 43 of the deflector 40 is positioned over the leading end 22 of the heat sink 20. The trailing edge 44 is positioned over the trailing end 24. The top surface 41 of the deflector 40 is oriented at a predetermined angle to the horizontal plane. In particular, the trailing edge 44 is horizontally higher than the leading edge 43. A camber 45 is formed on the bottom surface 42 of the deflector 40, deeper near the leading edge 43 and less pronounced at the trailing edge 44. The camber 45 is accordingly disposed over the valley 25 of the heat sink 20. The bottom surface 42 of the deflector 40 cooperates with the heat sink 20 to lead the airflow generated by the fan to efficiently pass through the heat sink 20.

Figure 4:
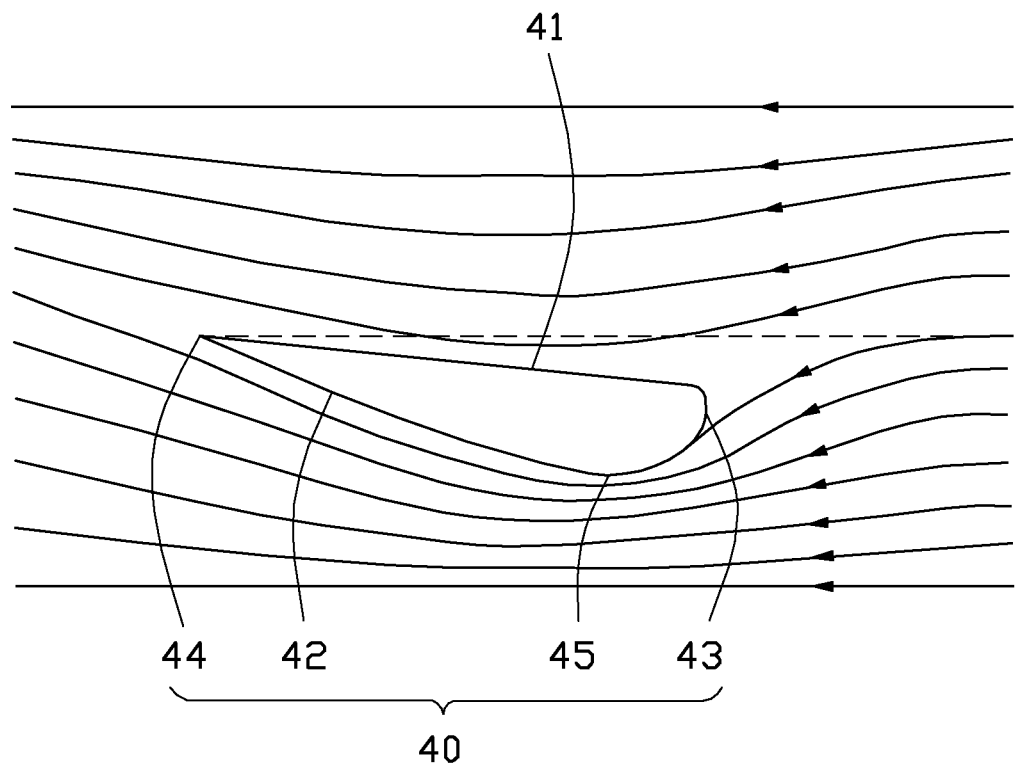
FIG. 4 is a side elevational view of airflow under and over a deflector of the heat dissipating module shown in FIG. 1.

FIG. 4 is a side elevational view of airflow over and under the deflector 40 of the heat dissipating module 100 shown in FIG. 1. When the airflow generated by the fan reaches the deflector 40, from the leading edge 43 to the trailing edge 44, the airflow is divided into two paths, one path is above the deflector 40, and the other path is below the deflector 40. The two paths of airflow are differentiated because of the different shapes of the top surface 41 and of the bottom surface 42. The airflow below the bottom surface 42 moves over the camber 45, so that the airflow is squeezed through a narrower gap; the airflow above the top surface 41 is not squeezed at all.

As stated in Bernoulli's Principle: when an object is in the path of an incompressible and non-sticky fluid, the object is subjected to a formula: $P+\rho gh+\rho v^2/2 = CONSTANT$, where P is fluid static pressure, $\rho$ is fluid density, g is gravity acceleration, h is height, and v is fluid velocity.

According to the Bernoulli's Principle, the airflow passage below the deflector 40 is longer and narrower, and according to conservation of mass, the airflow velocity below the deflector 40 increases; the airflow passage above the deflector 40 is shorter and unconstricted, and relative to the airflow below, the airflow velocity above the deflector 40 slower. Therefore, for a fan working at one steady speed, the velocity of the airflow passing through the gap between the upper surface of the heat sink 20 and the bottom surface 42 of the deflector 40 is increased, so that any heat in the heat sink 20 and the heat pipes 30 is removed faster.

The airflow velocities above and below the deflector 40 are different, the air pressures on the top surface 41 and on the bottom surface 42 are different. According to the formula given, the pressure difference can be calculated, where the difference between "ρgh" on the top surface 41 and on the bottom surface 42 is negligible, the pressure "P" is inversely proportional to the fluid velocity "v". The airflow velocity over the top surface 41 is less than the airflow velocity over the bottom surface 42, so that the static airflow pressure on the top surface 41 is greater than the static airflow pressure on the bottom surface 42. Therefore, the deflector 40 experiences a downward pressure (towards the CPU) from the airflow, the whole heat dissipating module 100 receives a downward pressure also, which makes the pedestal 10 cling harder to the CPU, and improves the conduction of heat from the CPU.

The heat dissipating module 100 conducts heat from the CPU by the pedestal 10, the heat sink 20, and the heat pipes 30. The aerofoil deflector 40 is supported by the heat pipes 30 above the heat sink 20, with a space between the upper surface of the heat sink 20 and the bottom surface 42 of the deflector 40. The shape of the aerofoil bottom surface 42 of the deflector 40 changes the velocity of the airflow passing over the bottom surface 42 and between the fins 21 of the heat sink 20, to better dissipate heat from the heat sink 20 and the heat pipes 30. In addition, the shape of the deflector 40 slightly increases the downward pressure from the airflow, to make the pedestal 10 cling harder to the CPU, so that the pedestal 10 conducts heat more efficiently from the CPU. The heat dissipating module 100 dissipates the heat faster and achieves a better heat dissipating result.

Even though numerous characteristics and advantages of the embodiments have been set forth in the foregoing description, together with details of the structure and function of the embodiments, the present disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. A heat dissipating module, comprising:
a heat sink, including an upper surface; and
an aerofoil deflector, mounted over the upper surface of the heat sink, the deflector including an aerofoil bottom surface spaced and facing the upper surface of the heat sink;
wherein the upper surface of the heat sink is in the shape of a V, along a direction of the airflow flowing therethrough, the heat sink further includes a valley defined on the upper surface, the valley divides the upper surface into two inclined sub-surfaces;
wherein the deflector includes a camber defined on the bottom surface, the camber is disposed over the valley.

2. The heat dissipating module of claim 1, wherein the heat sink further includes a leading end and a trailing end along a direction of the airflow flowing therethrough, the trailing end is higher than the leading end, and the leading end faces an airflow source.

3. The heat dissipating module of claim 2, wherein the heat sink includes a plurality of fins, a plurality of passages for airflow are formed between the plurality of fins.

4. The heat dissipating module of claim 1, further comprising a pedestal, wherein the heat sink is mounted perpendicularly on the pedestal, the pedestal is a heat conducting board, which is mounted clingy to a CPU and conduct heat from the CPU, the heat sink and the pedestal are made by stamping process.

5. The heat dissipating module of claim 1, wherein the deflector further includes a flat top surface opposites to the bottom surface, the top surface is oriented at a predetermined angle to the horizontal plane.

6. The heat dissipating module of claim 1, further comprising at least one heat pipe, wherein one end of the heat pipe runs through the heat sink, the other end protrudes above the heat sink and supports the deflector above the heat sink.

7. The heat dissipating module of claim 6, wherein the heat sink defines at least one hole near the bottom portion thereof, the deflector defines at least one connecting hole therethrough.

8. The heat dissipating module of claim 6, wherein the heat pipe is effectively endless, forming a closed ring in the shape of a rectangle, and includes a lower portion, two arms, and an upper portion, the lower portion is inside the hole of the heat sink, the two arms are located on the opposite ends of the heat sink, the upper portion protrudes above the upper surface of the heat sink and is inside the connecting hole of the deflector.

9. A computer, comprising a CPU and a heat dissipating module, the heat dissipating module comprising:
a pedestal, mounted clingy to the CPU and conducts heat from the CPU;
a heat sink, mounted perpendicularly on the pedestal, including an upper surface; and
an aerofoil deflector, mounted over the upper surface of the heat sink, the deflector including an aerofoil bottom surface spaced and facing the upper surface of the heat sink
wherein the upper surface of the heat sink is in the shape of a V, along a direction of the airflow flowing therethrough, the heat sink further includes a valley defined on the upper surface, the valley divides the upper surface into two inclined sub-surfaces;
wherein the deflector includes a camber defined on the bottom surface, the camber is correspondingly disposed over the valley.

10. The computer of claim 9, wherein the heat sink further includes a leading end and a trailing end along a direction of the airflow flowing therethrough, the trailing end is higher than the leading end, and the leading end faces an airflow source.

11. The computer of claim 10, wherein the heat sink includes a plurality of fins, a plurality of passages for airflow are formed between the plurality of fins.

12. The computer of claim 9, wherein the deflector further includes a flat top surface opposites to the bottom surface, the top surface is oriented at a predetermined angle to the horizontal plane.

13. The computer of claim 9, further comprising at least one heat pipe, wherein one end of the heat pipe is inserted through the heat sink, the other end is protruded above the heat sink and supports the deflector above the heat sink.

14. The computer of claim 13, wherein the heat sink defines at least one hole near the bottom portion thereof, the deflector defines at least one connecting hole therethrough.

15. The computer of claim 14, wherein The heat dissipating module of claim 8, wherein the heat pipe is effectively endless, forming a closed ring in the shape of a rectangle, and includes a lower portion, two arms, and an upper portion, the lower portion is inside the hole of the heat sink, the two arms are located on the opposite ends of the heat sink, the upper portion protrudes above the upper surface of the heat sink and is inside the connecting hole of the deflector.

* * * * *